United States Patent [19]
Uchikawa

[11] 3,935,481
[45] Jan. 27, 1976

[54] FIELD EFFECT TRANSISTOR SWITCH WITH ELECTRECT FOR CONTROL
[75] Inventor: Shoji Uchikawa, Iwaki, Japan
[73] Assignee: Kureha Kagaku Kogyo Kabushiki Kaisha, Tokyo, Japan
[22] Filed: Sept. 27, 1973
[21] Appl. No.: 401,297

Related U.S. Application Data
[63] Continuation of Ser. No. 125,791, March 18, 1971, abandoned.

[30] Foreign Application Priority Data
Mar. 19, 1970 Japan............................. 45-22660

[52] U.S. Cl. .................. 307/251; 307/309; 357/27
[51] Int. Cl.² ........................................ H03K 17/60
[58] Field of Search .......... 307/304, 309, 308, 251; 310/8, 8.8; 179/111 E; 317/262 R; 357/27

[56] References Cited
UNITED STATES PATENTS
| | | | |
|---|---|---|---|
| 2,752,553 | 6/1956 | Dunlap | 307/309 |
| 3,436,492 | 4/1969 | Reedyk | 179/111 E |
| 3,454,891 | 7/1969 | Siegel | 307/304 |
| 3,463,993 | 8/1969 | Beck et al. | 307/304 |
| 3,573,494 | 4/1971 | Houpt | 307/309 |

OTHER PUBLICATIONS
Amelco Semiconductors "FETs" No. 1, 6/62 pp. 1–7.
Electronics Illustrated, "The Electret" by Hyypia, pp. 97–99.

Primary Examiner—John S. Heyman
Attorney, Agent, or Firm—Sughrue, Rothwell, Mion, Zinn & Macpeak

[57] ABSTRACT
Disclosed is a method and device for controlling an electric circuit with the use of an electret with a rear electrode. The electric energy or signal transfer state of a field effect transistor is regulated by varying the electric field between the electret and an induction electrode, the field effect transistor being electrically connected to the combination of the electret and the induction electrode. The electric energy transfer state of the field effect transistor is regulated in response to the variation of the electric field, whereby the electric circuit to which the transistor is coupled is controlled.

4 Claims, 7 Drawing Figures

(A)    (B)

FIELD EFFECT TRANSISTOR SWITCH WITH ELECTRECT FOR CONTROL

This is a Continuation, of application Ser. No. 125,791, filed Mar. 18, 1971, now abandoned.

FIELD OF THE INVENTION

This invention relates to a system of controlling an electric circuit by the use of an electret. More particularly the invention pertains to a method and device for controlling an electric circuit by changing the electric signal or energy transfer condition of a field effect transistor by varying the electric field between the electret and an induction electrode coupled to the transistor.

SUMMARY OF THE INVENTION

In accordance with the present invention, the conductive state of a field effect type active element, such as a field effect transistor (FET) is changed in response to the operation of displacing an electret, induction electrode, field shielding plate and the like where the field effect transistor is electrically connected to the induction electrode and electret. The present invention is based on the phenomena that, in a combination of an electret and an induction electrode which is coupled to the electret by an electrostatic induction effect and the electric field caused by the electret, the electrostatic capacitance between the electret and the induction electrode is varied by variation of the gap between the electret and the induction electrode, or by entrance and exit of the field shielding plate relative to that gap. By appropriately selecting the operation characteristics of the FET and the electrical characteristics of input and output circuits, variation of the conductive state can be made two-positional, discretive or continuous in response to the displacement of the electret in relation to the induction electrode. Thus, on the basis of the foregoing principle, there is provided electric energy control devices such as switches, variable resistors, and potentiometers, realized without the use of electric contacts.

The relationship between the electret and the induction electrode is such that, when the induction electrode consists of a conductive or semiconductive body, grounded, or having large capacitance without specifically being connected to earth, the ratio of strength of the electric field between the inside and outside of the electret varies in response to approach of the body to the electret. This variation of the strength can be sensed by a FET connected to, for example, a rear electrode mounted on the rear surface of the electret. Thus, it may be considered to provide in accordance with the foregoing principle of operation a proximity switch which operates through, particularly, the electric field of the electret.

Further, it is possible to transform the electric field caused by the interaction a sector-shaped electret with an induction electrode of the same shape into an oscillating field by vibrating or rotating the electret; and to vary the oscillating electric field by positional displacement of the sector-type induction electrode, by approach of another induction electrode, or by entrance and exit of an electric field shielding plate relative to the field, and to therby actuate the FET.

Generally, the input impedance of an FET has, when its gate is used as an input end, a significantly large value irrespective of a small and large signal input. Particularly, since a junction type FET (J-FET) does not have a threshold voltage as does an MOS-FET, the output resistance of the J-FET in the unsaturated region of the drain current is modulated substantially linearly by an input voltage.

On the otherhand, the MOS-FET has a small leakage current at the gate terminal and a threshold voltage (for example, the enhancement type MOS-FET), so that the characteristics of this type FET are beneficial in making sure of the OFF state in case the output characteristic has to be two-positional or to provide a switch-like operation. The FET of the above type can be driven by electrostatic induction action through the electret. But, if the ON state of an input circuit is static, the lowering of the gate potential is large. Thus, the operation of the FET lags or becomes out of phase. This lowering of the gate potential is unavoidable to a certain degree. Thus, in the present invention it is preferable to use a varying input signal.

However, the rate of potential lowering depends on the time constant of the input circuit, or, basically, on the gate leakage current of the FET as used and the polarization charge density and electrostatic capacitance of the electret. In a feature of the present invention there is provided an electret having a significantly large charge density and electrostatic capacitance as the latter element whereby semi-static operation has been realized.

The electret having such characteristics as above may be made from high molecular material such as polystyrene, polymetylmethacrylate, polytetrafluoroethylene, polyfluorovinylidene, polyfluorovinyl, polycarbonate and polyethylenetelephthanlate, as well as various ceramic materials. Among the afore-mentioned materials, especially, polyfluorovinylidene there is realized remarkably high polarization charge density and dielectric constant. Thus, it allows the objects of the present invention to be realized and is suitable for stabilization of operation and miniaturization of the applied devices.

There are two types of electrets; the polarization type in which permanent electric polarization or mutually separated positive and negative independent charges are held in a balanced state, and the so-called monopole type in which in appearance a sole charge is held. Either one of the two types of the electret can be used.

Therefore, it is an object of the present invention to provide a system of controlling an electric circuit by the use of an electret.

It is another object of the present invention to provide a method of controlling an electric energy transfer state of a field effect transistor by the use of an electret.

It is still another object of the present invention to provide a method of controlling an electric circuit by the use of an electret in which the electric field of the electret is varied by movement of a body as well as the electret whereby the energy transfer state of an associated field effect transistor is regulated.

It is a still further object of the present invention to provide devices adapted to achieve the above-noted methods.

Therefore, in accordance with the present invention, there is provided a system of controlling an electric circuit by the use of an electret which is characterized in that the electric field between the electret with a rear electrode and an induction electrode is varied by movement of a body relative to the electric field or of the electret relative to the induction electrode, whereby a field effect transistor electrically connected to the electret and the induction electrode is regulated with respect to its electric signal or energy transfer condition. Further, there is provided a combination of the electret with a rear electrode, an induction electrode, and a field effect transistor electrically coupled to the formers, which operates in such a manner that the electric field appearing between the electret and the induction electrode is varied or modified in response to approach of a body or movement of the electret relative to the induction electrode whereby the electric energy or signal transfer state of the field effect transistor is accordingly changed with the result that any external electric circuit connected to the transistor can be controlled. Thus, the present invention can be realized in the form of contactless switch, contactless variable resistor, contactless potentiometer and the like.

DESCRIPTION OF THE PREFERRED EMBODIMENTS

Figure 1:
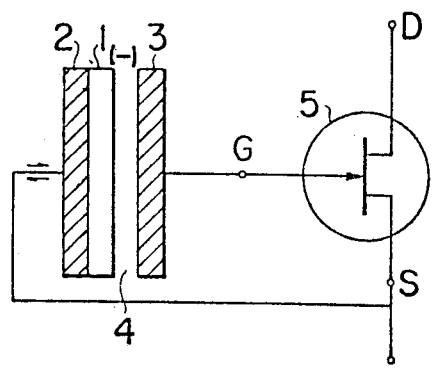
FIGS. 1 and 2 are schematic views of contactless resistance regulators embodying the operation principle of the present invention.

Now, several examples of the electric system according to the present invention will be described with reference to the drawing, which utilize, as a control technique, variation of the electric field of the electret resulting from movement of any body, particularly, the related phenomena between displacement of the electret or an external body and corresponding variation of electrical conductivity of a field effect transistor connected to the electret and induction electrode.

EXAMPLE 1

Figure 2:
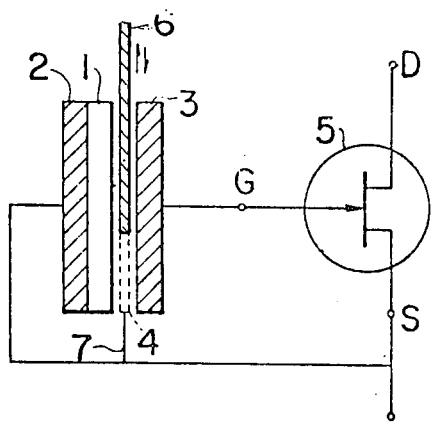

In FIGS. 1 and 2, the electric field caused by a plate electret 1 with rear electrode 2 plated thereto acts through a gap 4 and causes electric charge to be induced on an induction electrode 3 which is connected to a gate terminal G of an FET 5. Thus, a bias voltage is produced between the gate G and source S of the FET, whereby, due to this voltage, the electric conductivity between the source S and drain D is modified.

In this case, if a J-FET (for example, an N-channel depletion type J-FET) having no threshold voltage is used as the FET and if it is operated in the unsaturated region of drain current, it is possible to change the electric conductivity of the FET over a relatively wide range ($5\times10^{-3}v \sim 5\times10^{-9}v$). Thus, there is obtained a contactless variable resistor or potentiometer operable in response to displacement of the electret or any body.

In case of FIG. 1, if the electret 1 is displaced or moved towards or away from the induction electrode 3 or in the directions of the opposing axis therebetween, the electric resistance between the electrodes S and D varies proportionally to the amount of displacement. The electret may also be moved in the directions perpendicular to the opposing axis so as to vary the facing areas of the elements other than in the direction of varying in distance the gap between the electret and the induction electrode.

The embodiment shown in FIG. 2 utilizes the operation principle and has the purpose of application as the device in FIG. 1. However, a manipulatable or displaceable body such as field shielding plate 6 is inserted in the gap 4 between the electret 1 and the induction electrode 3. If the dielectric flux in the gap 4 is varied by means of movement of the field shielding plate 6 which is grounded through "7," the electric resistance between the source S and drain D of the FET 5 varies substantially linearly with respect to displacement of the field shielding plate, in accordance with the principle similar to that of FIG. 1.

EXAMPLE 2

Figure 3:
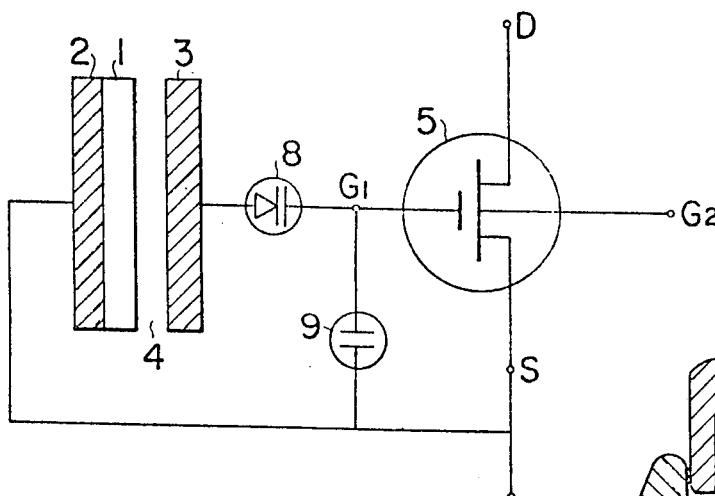
FIG. 3 is an explanatory view of the operation of a contactless switch constructed according to the principle of the present invention.

FIG. 3 is an explanatory view of operation of a contactless switch which is actuated by means of the electric potential of the electret. In this example, there is employed an MOS-FET which has a gate leakage current far smaller than that of the general FET in order to stabilize the gate potential. Thus, due to the threshold voltage of the MOS-FET the OFF state becomes certain.

In FIG. 3, if the FET 5 is, for example, a P-channel enhancement type MOS-FET having a threshold voltage, a minus (−) face of the electret 1 is selected as the face which opposes the induction electrode 3. The other face of the electret 1 is backed up with the rear electrode 2. The rear electrode is connected to the source S of the FET 5, the induction electrode 3 is connected to a first gate $G_1$ of the FET through a variable capacity diode 8. Between gate $G_1$ and source S is coupled a capacitor 9 for adjusting the operation characteristics.

In the foregoing construction, if the electret 1 is sufficiently spaced apart from the induction electrode 3, the potential of the gate $G_1$ is lower than the threshold voltage of the FET (in absolute value). Thus, the FET 5 is in the cut-off state between its source S and drain D.

If the electret 1 with the rear electrode 2 comes near to the induction electrode 3, the gate G is biased mainly by the variation of the electrostatic capacitance between the induction electrode 3 and electret 1. Therefore, the conductivity between the source S and drain D rises abruptly at a point exceeding the threshold value. The variable capacity diode 8 compensates for potential lowering of the gate $G_1$ due to its leakage current and, thus, is used to increase stability in the static ON state.

In connection with the above, variation of the electric field of the electret relative to the induction electrode can also be caused by varying the relative angle of the electret surface against the induction electrode or by the use of the field shielding plate as shown in FIG. 2. Further, it may be considered to cause the electric field of the electret to act directly on the FET's channel without using the induction electrode to thereby modulate the electric conductivity of that FET.

Figure 4:
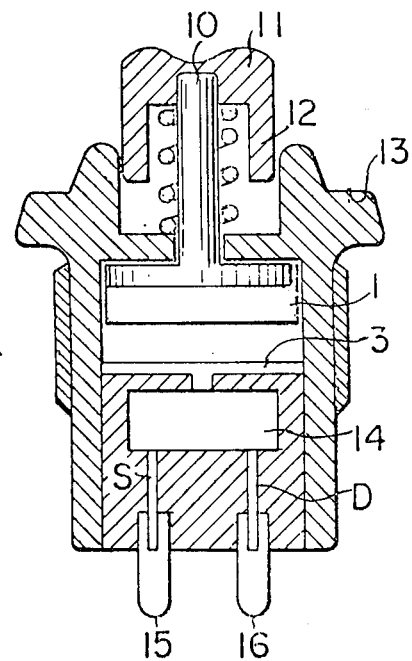
FIG. 4 is a structural view of the contactless switch shown in FIG. 3.

FIG. 4 shows an element having a switch mechanism embodying the afore-said operation principle. In this drawing there are shown an electret 1, the minus (−) surface of which faces an induction electrode 3, a guide shaft 10 for backing up and supporting the electret 1 and operable to displace the electret 1 with respect to the induction electrode 3, a push button 11 secured on the top of the shaft 10, and a spring 12 for urging upward the electret 1 through the guide shaft 10, the foregoing members being held by an electrostatically shielded insulating outer casing 13. The FET 5, diode 8 and capacitor 9 are housed in a portion 14, and the induction electrode 3, connection terminals 15 and 16 are wired in accordance with the circuit diagram shown in FIG. 3 or FIG. 4. Terminals 15 and 16 are connected, respectively, to the source S and drain D. In such a switch element as shown above, an external electric circuit connected between terminals 15 and 16 can provide, in response to manipulation of the push button 11 of the switch element, without intervention of electric contacts, ON-OFF switching action or abrupt variation in the conduction state.

EXAMPLE 3

Figure 5:
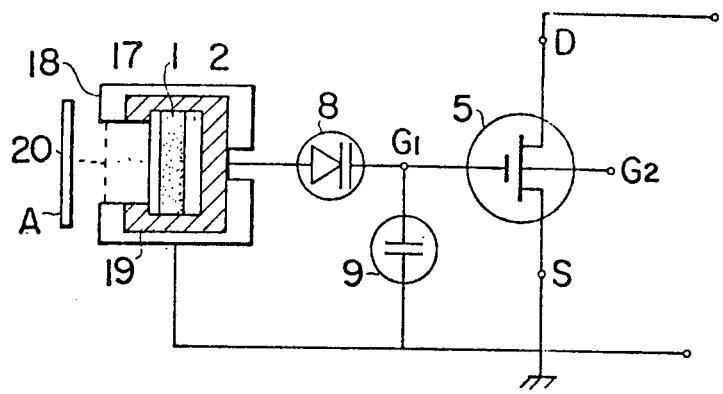
FIGS. 5 and 6 show embodiments of the proximity switch embodying the principle of the present invention.
Figure 6:
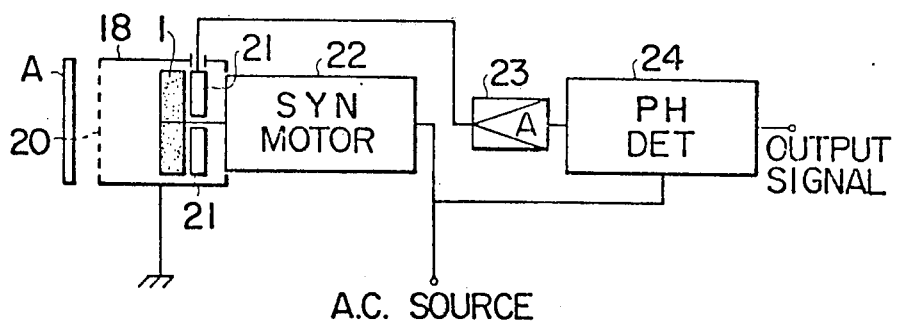

FIGS. 5 and 6 are explanatory views of proximity switches using the electret.

First, in FIG. 5 there are shown in electret 1, a rear electrode 2 for the electret, a surface protecting film 17 of the electret, and an outer casing 118 for electrostatically shielding the foregoing elements by means of an insulation 19. The outer casing 18 is formed with a window in front of the electret 1 and at this window there is provided a metal net 20 of an appropriate mesh size for protecting the inside and adjusting the operation characteristics. To the rear electrode 2 a switch circuit similar to that of Example 2 shown in FIG. 3 is connected.

In such electrode structure and circuit configuration including the electret in a manner as above, the electric field distribution inside and outside the electret 1 varies in response to approach of a conductive or semiconductive body having an area so large as that of the window and being grounded, or approach of a dielectric body A which can change the electrostatic capacitance appearing from the electret 1 to the window largely as a grounded body does, towards the electret front window, that variation of the distribution being sensed by the FET 5 through the rear electrode 2.

In the foregoing construction, if the input characteristic of the FET 5 is made such as is the case of Example 2, the output end between electrodes S and D of the FET is switched stably between ON and OFF upon approach of the body.

FIG. 6 is an explanatory drawing of the proximity switch using a phase detection system in order to improve the operation reliability in accordance with the principle as above. The proximity switch of FIG. 5 malfunctions possibly if it is operated in the ambient where static electricity generates or in the vicinity of a high voltage power source; thus, the embodiment of FIG. 5 is limited in its application condition.

In order to avoid the above limits, the detector of FIG. 6 is constructed so that the electret 1 is rotated by a synchronous motor 22 and the electric field of the electret 1 is sensed by the rear electrode 21 in terms of an oscillating field of a certain frequency.

Figure 7:
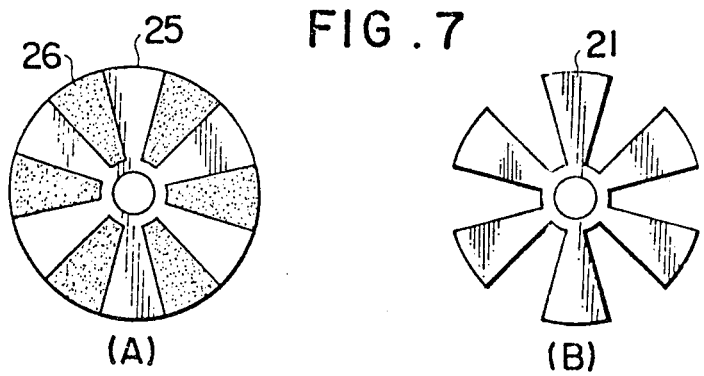
FIGS. 7A and 7B show parts of the proximity switch shown in FIG. 6.

In more detail, a face 21' of the electret 1 facing its rear electrode 21 is covered at its charging surface with a radial conductive sector 25 having a certain number of wing portions to leave regularly spaced exposed portions and grounded therethrough, as shown in FIG. 7A. In FIG. 7A, portions 26 are the exposed areas of the electret 1, and the rear electrode 21 has a shape analogous to the shape of the sector 25, as shown in FIG. 7B.

When the electret 1 having the foregoing configuration is rotated, the voltage induced thereby in the rear electrode 21 becomes an oscillating voltage. The frequency of the induced voltage is determined by the revolution speed and the number of the wing portions, the magnitude is varied by approach of various bodies (A) towards the front of the electret 1 like the case of FIG. 5, and its variation is sensed by the rear electrode 21, through a tuned amplifier 23 and phase detector 24, and output in the form of a D.C. signal voltage. In this case, similarly, if the characteristic of the amplifier 23 is properly made non-linear, a two-positional output signal can be realized in response to the approach of a body.

By the use of such a detection system as above, it is possible to isolate the field of the electret from the other static electricity and high voltage, and to ensure reliable operation of the proximity switch. The detection system can also be realized by the use of a vibration system, other than the provision of rotating the electret.

It will be noted that, in the proximity switch, the approaching body can be replaced by the induction electrode, then, the field distribution variation of the electret due to approach of the body seems to be sensed by the rear electrode 2 or 21.

Although the invention has been described with respect to the preferred embodiments thereof, it is understood by those skilled in the art that various modifications can be made in construction and arrangement within the scope of the invention as defined in the appended claims.

What is claimed is:

1. A method for controlling the ON-OFF state of an electric switching circuit including a MOS type field effect transistor having gate, source, and drain electrodes and having a threshold level above which said transistor is in the ON conducting state, an electret and an induction electrode, comprising the steps of;

coupling said induction electrode in an operable relationship to the gate electrode of said field effect transistor;

coupling said electret in an operable relationship to the source electrode of said field effect transistor;

positioning said electret with respect to said induction electrode in a first spaced apart relationship such that said electret and induction electrode are electrostatically coupled and the electric field therebetween induces a voltage between the gate and source of said field effect transistor that is below the threshold level of said field effect transistor whereby said field effect transistor is in the OFF conducting state, and positioning said electret with respect to said induction electrode in a second spaced apart relationship such that said electret and induction electrode are electrostatically coupled and the electric field therebetween induces the gate-source voltage that is above the threshold level of said field effect transistor whereby said field effect transistor is in the ON conducting state.

2. The method of claim 1 wherein the step of positioning in a second spaced apart relationship comprises the step of moving said electret towards said induction electrode.

3. A contactless ON-OFF switch comprising:

a. a MOS field effect transistor of the type having source, gate, and drain electrodes and having a drain-source ON conducting state when the gate-source voltage exceeds a threshold voltage and having a drain-source OFF conducting state when the gate-source voltage is below said threshold voltage, b. an induction electrode electrically coupled to said gate electrode, c. the combination of an electret and backing electrode in contact with one face of said electret, said backing electrode being electrically coupled to said source electrode, d. mechanical biasing means for biasing said combination in a first position in which said electret face not in contact with said backing electrode faces said induction electrode, the spacing between said electret and said induction electrode in said first position being such that a voltage of a first value is applied across the gate-source electrodes of said field effect transistor, and e. manually actuable means for overcoming said biasing means to place said combination in a second position in which the spacing between said electret and said induction electrode results in a voltage of a second value being applied across the gate-source electrodes of said field effect transistor, wherein one of said first and second values is above said threshold voltage and the other of said first and second values is below said threshold voltage.

4. A contactless ON-OFF switch comprising:

a. a field effect transistor of the type having source, gate, and drain electrodes and having a drain-source ON conducting state when the gate-source voltage exceeds a threshold voltage and having a drain-source OFF conducting state when the gate-source voltage is below said threshold voltage, b. an induction electrode electrically coupled to said gate electrode, c. the combination of an electret and backing electrode in contact with one face of said electret, said backing electrode being electrically coupled to said source electrode, d. mechanical biasing means for biasing said combination in a first position in which said electret face not in contact with said backing electrode faces said induction electrode, the spacing between said electret and said induction electrode in said first position being such that a voltage of a first value is applied across the gate-source electrodes of said field effect transistor, e. manually actuatable means for overcoming said biasing means to place said combination in a second position in which the spacing between said electret and said induction electrode results in a voltage of a second value being applied across the gate-source electrodes of said field effect transistor, wherein one of said first and second values is above said threshold voltage and the other of said first and second values is below said threshold voltage, f. a variable capacity diode serially coupled between said gate of said field effect transistor and said induction electrode; and g. a capacitor connected between said gate and source electrodes.

* * * * *